FIELD-EFFECT TRANSISTOR AMPLIFIER

Filed Dec. 17, 1962 2 Sheets-Sheet 1

INVENTOR.
DAVID J. CARLSON
BY
Eugene M. Whitacre
Attorney

INVENTOR.
DAVID J. CARLSON
BY Eugene M. Whitacre
Attorney

United States Patent Office 3,513,405

Patented May 19, 1970

3,513,405

FIELD-EFFECT TRANSISTOR AMPLIFIER

David J. Carlson, Princeton, N.J., assignor to RCA Corporation, a corporation of Delaware Filed Dec. 17, 1962, Ser. No. 245,055
Int. Cl. H03f *1/32, 3/16;* H03g *3/30*
U.S. Cl. 330—29 15 Claims This invention relates in general to signal translating circuits employing semiconductor devices and more particularly to amplifier circuits employing insulated gate field effect semiconductor devices.

It is an object of this invention to provide an improved amplifier circuit employing field effect semiconductor devices.

It is another object of the invention to provide an improved high frequency amplifier circuit including a field effect semiconductor device which provides reduced cross modulation distortion and good stability in operation throughout the very high frequency (VHF) and ultra high frequency (UHF) frequency ranges as compared to known types of junction transistors.

It is still another object of this invention to provide an improved semiconductor amplifier circuit having remote cut-off transconductance characteristic.

It is a further object of this invention to provide an improved gain control amplifier circuit employing a field effect semiconductor device.

An amplifier circuit embodying the invention comprises an insulated gate field effect semiconductor device which has first and second electrodes which may be interchangeable operated as drain and source electrodes. The first and second electrodes are formed on a substrate of semiconductor material in spaced relation, but connected by a conducting channel. A gate electrode, insulated from the semiconductor substrate and conducting channel, is disposed between the first and second electrodes in a position closer to the second electrode. An input circuit is connected between the gate and second electrodes. An output circuit and a source of unidirectional potential having positive and negative voltage terminals are coupled between the first and second electrodes in a manner such that the first electrode is biased positively with respect to the second electrode so that the first electrode operates as a drain electrode and the second electrode operates as the source electrode.

A feature of the invention is the use of a field effect semiconductor device having an insulated offset gate electrode, as the R.F. amplifier of a television receiver or the like to provide reduced cross modulation distortion and improved stability characteristics as compared to junction transistors.

Another feature of the invention comprises first and second field effect semiconductor devices connected in parallel, and each having a relatively sharp cut-off transconductance characteristic. The gate electrodes of the first and second field effect semicondutor devices are biased to different bias potentials to obtain a composite transconductance characteristic having remote cut-off to further reduce the cross modulation distortion.

Still another feature of the invention comprises a high frequency amplifier stage including a field effect semiconductor device having a substrate of semiconductor material on which the source and drain electrodes are formed. The substrate of semi-conductor material and the boundaries of the source and drain electrodes operate effectively as a pair of rectifying junctions connected between the source and drain electrodes and the substrate of semiconductor material. The rectifying junctions are biased into conduction when the substrate of semiconductor material is positively biased with respect to the source and drain electrodes respectively. A gain control voltage derived from a suitable source is applied to the substrate to control the amplifier gain. As the gain control voltage becomes more positive, and the resistance of the rectifying junctions is decreased, the gain of the amplifier decreases.

The novel features which are considered characteristic of the invention are set forth with particularity in the appended claims. The invention itself, however, both as to its organization and method of operation as well as additional objects and advantages thereof will best be understood from the accompanying drawing in which:

Figure 1:
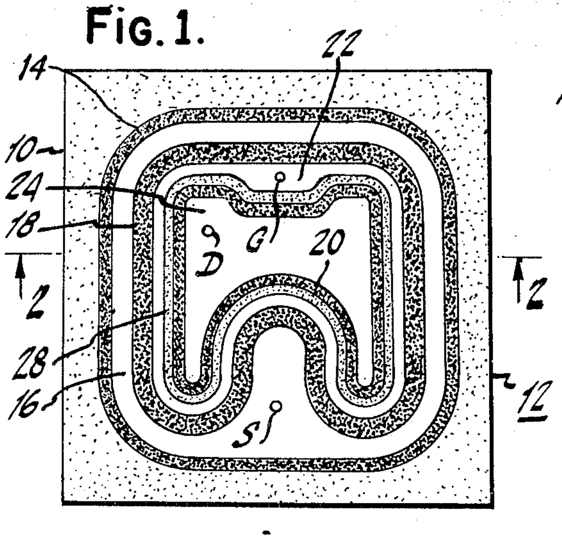
FIG. 1 is a diagrammatic view of a field effect transistor suitable for use in circuits embodying the invention.

Referring now to the drawings and particularly to FIG. 1, a field effect transistor 10 which may be used with circuits embodying the invention includes a body 12 of semiconductor material. The body 12 may be either a single crystal or polycrystalline and may be of any of the semiconductor art. For example, the body 12 may be nearly intrinsic silicon, such as for example lightly doped P-type silicon of 100 ohm cm. material.

In the manufacture of a device shown in FIG. 1, heavily doped silicon dioxide is deposited over the surface of the silicon body 12. The silicon dioxide is doped with N-type impurities. By means of a photo-resist and acid etching, or other suitable technique, the silicon dioxide is removed where the gate electrode is to be formed, and around the outer edges of the silicon wafer as viewed on FIG. 1. The deposited silicon dioxide is left over those areas where the source-drain regions are to be formed.

Figure 2:
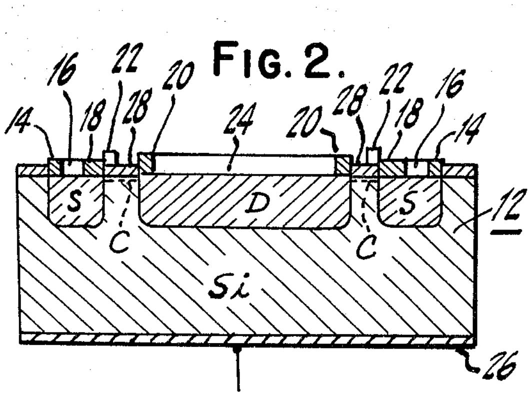
FIG. 2 is a cross section view taken along section line 2—2 of FIG. 1.

The body 12 is then heated in a suitable atmosphere such as in wafer vapor so that exposed silicon areas are oxidized to form grown silicon dioxide layers indicated by the stippled areas of FIG. 1. During the heating process, impurities from the deposited silicon dioxide layer diffuse into silicon body 12 to form the source and drain regions. FIG. 2, which is a cross section view taken along section line 2—2 of FIG. 1, shows the source-drain regions labeled S and D respectively.

By means of another photo-resist and acid etching or like step the deposited silicon dioxide over part of the source-drain diffused regions are removed. Electrodes are formed for the source, drain and gate regions by evaporation of a conductive material by means of an evaporation mask. The conductive material evaporated may be chromium and gold in the order named, for example, but other suitable metals may be used.

The finished wafer is shown in FIG. 1, in which the stipped area between the outside boundary and the first dark zone 14 is grown silicon dioxide. The white area 16 is the metal electrode corresponding to the source electrode. Dark zones 14 and 18 are deposited silicon dioxide zones overlying the diffused source region and the dark zone 20 is a deposited silicon dioxide zone overlying the diffused drain region. White areas 22 and 24 are the metallic electrodes which correspond to the gate and drain electrodes respectively. The stippled zone 28 is a layer of grown silicon dioxide on a portion of which the gate electrode 22 is placed and which insulates the gate electrode 22 from the substrate silicon body 12 and from the source and drain electrodes as shown in FIG. 2. The silicon wafer is mounted on a conductive base or header 26 as shown in FIG. 2. The layer of grown silicon dioxide 28 on which the gate electrode 22 is mounted, overlies an inversion layer or conducting channel connecting the source and drain regions. The gate electrode 22 is displaced towards the source region S so that the distance between the source region S and the gate electrode 22 is smaller than the distance between the gate electrode 22 and the drain region D. If desired, the gate electrode may overlap the deposited silicon dioxide layer 18. The advantages obtained by the configuration shown in FIGS. 1 and 2 will be pointed out subsequently in conjunction with the description of FIGS. 5 and 6.

Figure 3:
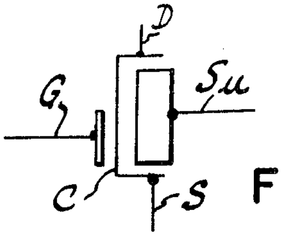
FIG. 3 is a symbolic representation of an insulated gate field effect transistor.

FIG. 3 is a symbolic representation of the insulated gate field effect transistor previously described in FIGS. 1 and 2. There is shown the gate electrode G, the drain electrode D, the source electrode S, and the substrate of semiconductor material $S_u$. The gate electrode is displaced towards the source electrode as described in reference to FIGS. 1 and 2. It should be noted that electrodes D and S operate as the drain and the source electrodes as a function of the polarity of the bias potential applied therebetween; i.e. the electrode to which a positive bias potential is applied (relative to the bias potential applied to the other electrode) operates as a source electrode.

The drain and source electrodes are connected to each other by a conductive channel C. The electrons flow from source to drain in this thin channel region close to the surface. The conductive channel C is shown in FIG. 2 in dotted lines.

Figures 4, 5, 6, 7:
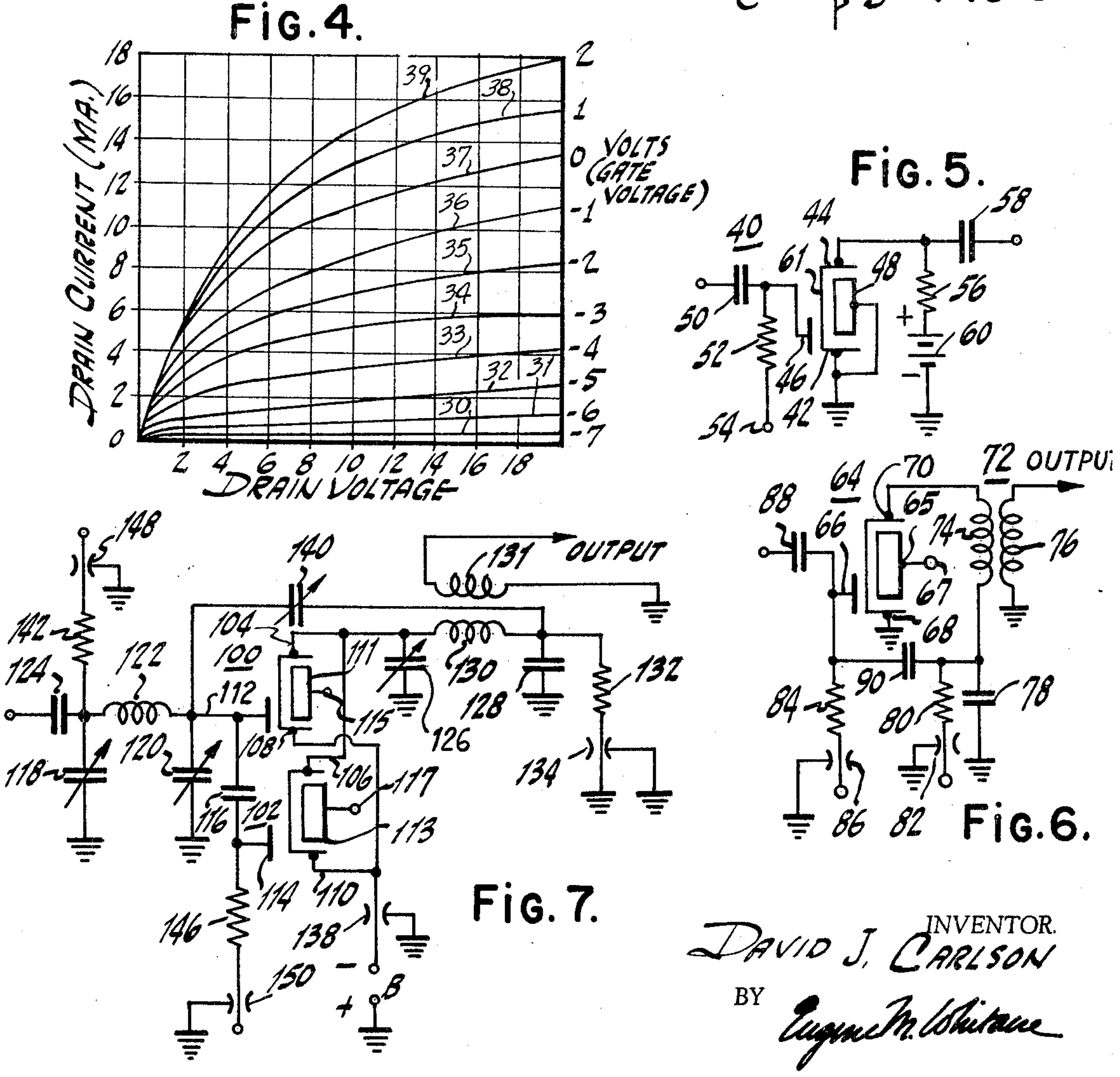
FIG. 4 is a graph showing a family of drain current versus drain voltage curves, for various values of gate-to-source voltages for the transistor of FIG. 1.
FIG. 5 is a schematic circuit diagram of an amplifier circuit embodying the invention.
FIG. 6 is a schematic circuit diagram of a tuned high frequency amplifier embodying the invention.
FIG. 7 is a schematic circuit diagram of a high frequency amplifier circuit utilizing two field effect transistors connected in parallel having a transconductance versus gate voltage composite characteristic with remote cut-off.

FIG. 4 is a family of curves 30–39 illustrating the drain current versus drain voltage characteristic of the transistor of FIG. 1 for different values of gate-to-source voltage. A feature of an insulated-gate field effect transistor is that the zero bias characteristic can be at any of the curves 30–39. In FIG. 4 the curve 37 corresponds to the zero bias gate-to-source voltage. Curves 38 and 39 represent positive gate voltages relative to the source and the curves 30–36 represent negative gate voltages relative to the source.

The location of the zero bias curve is selected during the manufacture of the transistor, i.e. by controlling the time and/or temperature of the step of the process when the silicon dioxide layer 28 shown in FIGS. 1 and 2 is grown.

Reference is now made to FIG. 5 which is a schematic diagram of an amplifier circuit employing an insulated gate field effect transistor 40 similar to the one described in FIGS. 1, 2 and 3. The transistor 40 has a source electrode 42, a drain electrode 44, a gate electrode 46 and a substrate of semiconductor material 48. The source electrode 42 is connected to a point of reference potential shown as ground. The drain electrode 44 is connected through a resistor 56 to the positive terminal to a source of bias potential 60. The negative terminal of the bias potential source 60 is connected to ground. In the present instance the electrode 44 which is physically displaced furthest from the gate electrode 46 and hence is identified as the drain electrode. The electrode 42 positioned closest to the gate electrode and hence is identified as the source electrode. It should be noted that the electrode 44 could be connected to function as the source electrode, and the electrode 42 as the drain electrode, but without the benefits of the invention.

The gate electrode 46 is biased to a desired bias potential from a source of bias potential (not shown) through a resistor 52. It is to be understood that: (1) the source of bias potential for the gate electrode 46 may comprise the source 60 with an appropriate voltage divider network, and (2) the resistor 52 may be grounded depending on the current drain v. drain voltage characteristic of the transistor used and the desired operating region of the transistor.

Input signals are coupled to the gate electrode 46 through a coupling capacitor 50 from a signal source (not shown) and output signals are derived across the resistor 56 and coupled through a coupling capacitor 58 to a utilization circuit (not shown). The substrate 48 is connected to the source electrode 42.

The transistor 40 is an insulated offset gate field effect transistor, as shown in FIGS. 1 and 2. With the gate electrode closer to the source electrode, the inherent capacitance between the gate electrode and the drain electrode is decreased and consequently the inherent feedback through this capacitance is reduced so that operating stability is obtained throughout a wide range of frequencies without the necessity of a neutralizing network. At very high frequencies some neutralization may be required, but the criticality of design of such neutralizing circuit is substantially reduced because of the reduced output-to-input electrode capacitance. It is to be noted that the gate electrode 46 is insulated from the substrate 48 and from the source and drain electrodes 42 and 44 so that there is substantially no flow of gate current.

Another advantage obtained by displacing the gate electrode 46 towards the source electrode 42 is that most of the intrinsic opposition to current flow in the conductive channel 61 (which connects the drain and source electrodes 44 and 42 and which may be described as resistive) is placed in the drain or output circuit of the field transistor 40. This increases the gain of the amplifier circuit by overcoming the intrinsic degeneration of the device. Stated in other terms, the offset gate electrode places more of the channel resistance on the drain side of the gate electrode, thereby reducing the amount of channel resistance effectively in circuit between the gate and source electrodes. By reducing the amount of resistance between the gate and source electrodes (input electrodes), the amount of signal degeneration is reduced. Furthermore, since the series input resistance is reduced, the speed of the circuits is increased permitting higher frequency of operation.

It is to be noted that the circuits shown in FIGS. 5, 6, 7, 8, 9 and 10 include field effect transistors having offset gates and hence all the circuits have the advantage of higher intrinsic gain as a result of having substantially reduced intrinsic degeneration.

Referring now to FIG. 6, there is shown a tuned amplifier circuit employing a field effect transistor 64 which is similar to the one shown in FIGS. 1 and 2 having gate, source and drain electrodes 66, 68 and 70.

A tuned output circuit is coupled to the drain electrode 70. The output circuit includes a transformer 72 having a primary winding 74 and a secondary winding 76. One end of the primary winding 74 is directly connected to the drain electrode 70, and the other end thereof is coupled through a fixed capacitor 78 to ground. The source electrode 68 is grounded. A circuit including a resistor 80 and a feedthrough capacitor 82 is connected to the primary winding 74 to apply a positive bias potential to the drain electrode 70 from a source of direct-current voltage (not shown). The gate electrode 66 is biased to a desired bias potential from a suitable source of bias potential (not shown) through a circuit including a resistor 84 and the feedthrough capacitor 86.

Input signals are applied through the coupling capacitor 88 from a source of input signals (not shown). A capacitor 90 is coupled between the gate electrode 66 and the bottom side of the primary winding 74 of transformer 72 to provide neutralization.

The neutralizing network comprises a bridge circuit including the inherent gate-to-drain capacitance, the drain-to-ground capacitance, the capacitor 78 and the neutralizing capacitor 90. Because the inherent gate-to-drain capacitance of the transistor 64 is very small due to the physical displacement of the gate electrode 66 towards the source electrode 68, the criticality of neutralization is reduced. Thus, the problem of the design and building of a neutralized circuit, which can be easily reproduced, is greatly diminished.

Reference is now made to the amplifier circuit schematically shown in FIG. 7 in which two insulated gate field effect transistors 100 and 102 are connected in parallel. The respective drain electrodes 104 and 106 of transistors 100 and 102 are connected to each other, and so are the respective source electrodes 108 and 110 of the transistors 100 and 102.

The gate electrodes 112 and 114 of the respective transistors 100 and 102 are A.C. coupled through a coupling capacitor 116 which is of low impedance at signal frequencies and which isolates the gate electrodes from each other D.C. wise. The substrates of semiconductor material 111 and 113 of semiconductor devices 100 and 102 have terminals 115 and 117 which are unconnected.

Input signals from a source, not shown, are coupled through a coupling capacitor 124 to a tunable input circuit comprising grounded variable capacitors 118 and 120 coupled to each other by an inductor 122 to form a resonant circuit. Input signals developed in the input circuit are coupled to the gate electrode 112 of transistor 100.

A tunable output circuit is coupled to the drain electrodes 104 and 106. The tunable output circuit comprises the variable capacitor 126 and the fixed capacitor 128 which resonate with the inductor 130 at the desired signal frequency.

The output signals from the amplifier circuit are derived from inductor 131 which is inductively coupled to the inductor 130 in the tuned output circuit. The source electrodes 108 and 110 are connected to the negative terminal (−) of a suitable bias source potential B (not shown) through a feedthrough capacitor 138. The positive terminal of the bias potential source B is grounded. Current flows from ground and through resistor 132, inductor 130, the drain electrodes 104 and 106, the source electrodes 108 and 110 to the negative terminal of the source of bias potential B.

Neutralization of the amplifier is obtained by means of a variable capacitor 140 in the manner described in reference to the neutralization of the amplifier circuit shown in FIG. 6.

The gate electrodes 112 and 114 are separately biased to different values of bias potential from suitable bias potential sources (not shown) through bias circuits including resistors 142 and 146 and feedthrough capacitors 148 and 150. Resistor 142 and capacitor 148 being coupled to gate electrode 112, and resistor 146 and feedthrough capacitor 150 being coupled to gate electrode 114.

Figure 11:
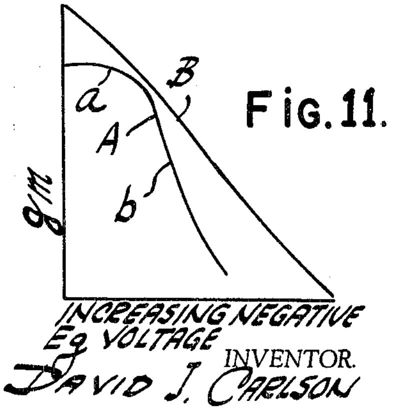
FIG. 11 is a graph showing the transconductance versus gate voltage characteristic of a single field effect transistor and the composite characteristic of a pair of field effect transistors having different gate bias voltages.

The field effect transistors 100 and 102 each have a sharp cut-off transconductance versus gate voltage characteristic as shown by curve A in FIG. 11. By connecting the field effect transistors in parallel and by separately biasing the respective gate electrodes to different bias potentials, a composite remote cut-off transconductance versus gate voltage characteristic is obtained as shown by curve B in FIG. 11. Curves A and B in FIG. 11 show the logarithmic change in transconductance ($g_m$) from a point of maximum value of transconductance at a given gate to source bias voltage to other values of transconductance for increasingly negative gate-to-source bias voltages. The transconductance is defined as the change in drain current divided by the change in input signal voltage at a given gate-to-source bias voltage. Curve A of FIG. 11 shows that the $g_m$ versus gate to source bias voltage characteristic has a first portion *a*, which is substantially flat, and a second portion *b* which has a substantially sharp slope. The first portion *a* starts from the point of maximum transconductance and is substantially flat to a point in which the drain current versus drain voltage curves start getting closer to each other. By connecting two field effect transistors in parallel and by biasing the gate electrodes as previously described, the $g_m$ vs. gate voltage characteristic may be modified to be substantially linear as shown by curve B in FIG. 11. This improves the performance of the unit in that cross-modulation distortion is reduced. It has been found that the circuit described gives better results than an amplifier circuit employing a junction transistor in that cross-modulation distortion is substantially less than in the circuit using the junction transistor.

Figure 8:
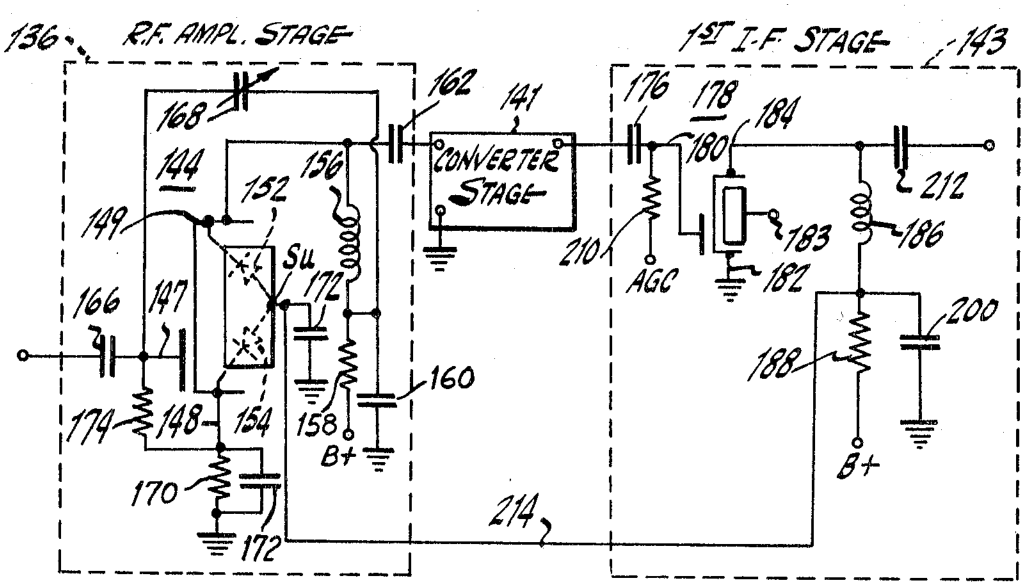
FIG. 8 is a schematic circuit diagram partly in block form of a portion of a signal receiver including a gain controlled R.F. amplifier circuit.

Reference is now made to the circuit shown in FIG. 8. There is shown an R-F amplifier stage 136 coupled to a converter stage 141, which is in turn coupled to the first I-F stage 143 of a signal receiver.

The R-F amplifier stage 136 includes an insulated gate field effect transistor 144, similar to the ones shown in FIGS. 1 and 2. The field effect transistor 144 has gate, source and drain electrodes 147, 148 and 149, and a substrate of semiconductor material shown as a terminal $S_u$. The source and drain regions S and D, shown in FIG. 2, are doped (N+) and the substrate of silicon body is effectively dopped N so that a pair of rectifying junctions 152 and 154 are found between the drain and source regions respectively and the substrate. The substrate side of these diodes operates effectively as the anode. The drain electrode 149 is connected through a series circuit including an inductor 156 and a resistor 158 to a B+ terminal which is in turn connected to the positive terminal of a source of bias potential (not shown). The resistor 158 is coupled through a capacitor 160 to ground. The drain electrode 149 is coupled through a coupling capacitor 162 to the converter stage 141.

It is to be understood that the poling of the rectifying junctions 152 and 154 is representative of a transistor of the type described in connection with FIGS. 1 and 2 wherein the substrate is of P-type material relative to the source and drain electrodes. However, the transistor device can be fabricated where the substrate is of N-type material relative to the source and drain electrodes. In devices of the latter type the rectifying junctions would be oppositely poled such that the anode side of the rectifying junction appears at the source and drain electrodes, and the cathode side of these junctions appears at the substrate electrode. The description herein will be restricted to the type of device described in connection with FIGS. 1 and 2 wherein the substrate electrode is of P-type material relative to the source and drain electrodes.

Input signals are coupled from a signal source (not shown) through a coupling capacitor 166 to the gate electrode 147 of the field effect transistor 144. A variable capacitor 168 is connected between the drain electrode and the gate electrode of the field effect transistor 144 to provide neutralization in the manner described in connection with FIGS. 6 and 7. The source electrode 148 is coupled through a resistor 170 to ground. The source electrode circuit is bypassed to ground for signal frequencies by the bypass capacitor 172 which is connected across the resistor 170. A capacitor 172 couples the terminal $S_u$ to ground. A resistor 174 is coupled between the gate electrode 147 and the source electrode 148 of transistor 144 in order to reference the potential of the gate electrode 147 to the potential at the source electrode 148.

The output of the converter stage 141 is coupled by means of a coupling capacitor 176 to the input of the first I-F stage 143. The first I-F stage comprises an insulated gate field effect transistor 178 similar to the field effect transistor 144. The field effect transistor 178 includes gate, source and drain electrode 180, 182 and 184. The drain electrode 184 is connected through an inductor 186 and a resistor 188 to a B+ terminal of a source or bias potential (not shown), which may be the same source of bias potential used to bias the drain electrode 149 of the field effect transistor 144. Resistor 188 is bypassed by a capacitor 200 to ground. The substrate of semiconductor material 183 of the insulated gate field effect transistor 178 is left floating.

The output signals from the first I-F stage 143 are coupled to a utilization circuit (not shown) through a capacitor 212. AGC signals which vary as a function of average signal level are applied through a resistor 210 to the gate electrode 180 of the field effect transistor 178. The drain electrode 184 of the field effect transistor 178 is coupled to the terminal $S_u$ of the field effect transistor 144 to apply an AGC voltage to the R-F amplifier stage 136 by means of a conductor 214 which is connected between the connection of the inductor 186 and the resistor 188 and the terminal $S_u$.

The AGC signals which are derived from any suitable source are applied to the gate electrode 180 through the resistor 210. The AGC signal becomes more negative as signal level increases to decrease the source-drain current of the transistor 178, and thereby reduce its gain. The potential across the resistor 188 which becomes more positive as the drain current of the field effect transistor 178 decreases is applied to the substrate terminal $S_u$. If desired, an isolating resistor can be connected in series in the conductor 214. When the potential at the terminal $S_u$ becomes more positive than the potential of the source and gate electrodes 148 and 149 rectifying junctions 154 and 152 are respectively rendered conductive. One of the rectifying junctions 152 and 154 may be rendered conductive first, depending on which of the drain and source electrodes 149 and 148 respectively is less positive relative to the substrate $S_u$. When the potential at the terminal $S_u$ becomes more positive than the bias potential at the source electrode 148, the rectifying junction 154 is rendered conductive, thus increasing the current flow through the resistor 170. However, the relative bias voltage between the gate electrode 147 and the source electrode 148 remains the same because the gate electrode is referred to the source electrode through the resistor 174. When the potential of the terminal $S_u$ becomes more positive than the potential at the drain electrode 150, then the rectifying junction 152 is rendered conductive. The conduction of the rectifying junction 152 effectively connects the drain-electrode 149 to ground for signal frequencies through the rectifying junctions 152 and 154 and the capacitor 172 whereby the gain of the R-F amplifier stage is reduced.

Figure 9:
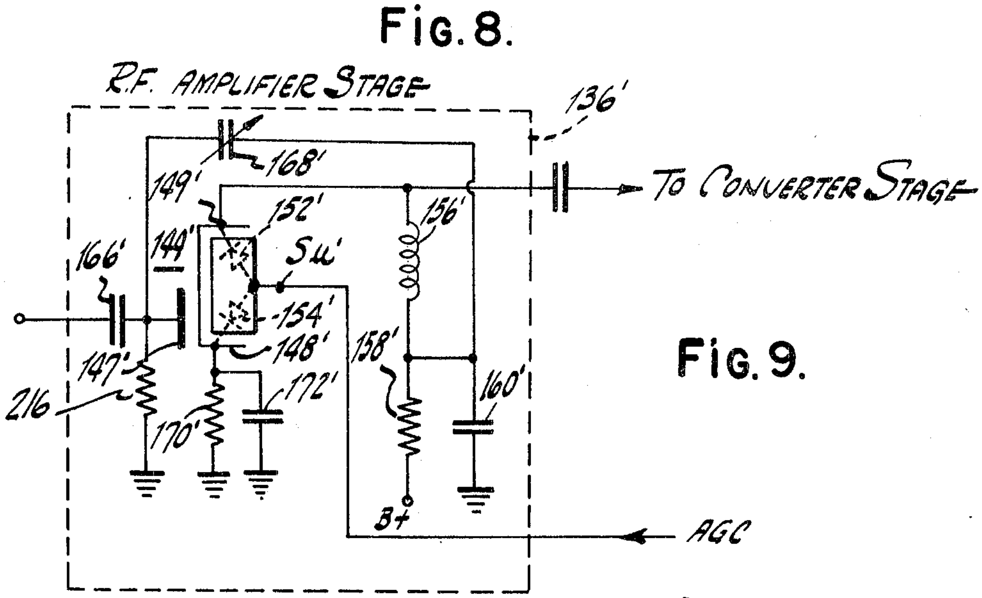
FIG. 9 is a schematic circuit diagram of the R.F. amplifier stage of a signal receiver, similar to the R.F. amplifier stage shown in FIG. 7, with delayed gain control illustrating another embodiment of the invention.

FIG. 9 shows an R-F amplifier stage 136′ which is similar to the R-F amplifier stage 136 described in connection with FIG. 8. The elements in the R-F amplifier stage 136′ which are substantially the same as to the elements of the R-F amplifier stage 136 of FIG. 8 are identified by the same numeral. The main difference between the stages 136 and 136′ is the biasing of the gate electrodes 147 and 147′ respectively. In the R-F amplifier stage 136′ the gate electrode 147′ is coupled through a resistor 216 to a point of bias potential shown as ground.

As signal level increases, the AGC voltage applied to the terminal $S_u'$ of the field effect transistor 144′ becomes more positive. When the potential of the terminal $S_u'$ becomes more positive than the bias potential of the source electrode 148′ the rectifying junction 154′ is rendered conductive, which in turn increases the amount of current flow through the self biasing resistor 170′. Since the voltage across the resistor 170′ appears between the source and gate electrodes, the operating point of the transistor is changed due to the added current from the rectifying junction 154′. When the bias potential between the source and gate electrodes reaches a preselected value the field transistor 144′ is rendered substantially cut off.

In another embodiment of the invention the gate electrode 147′ may be biased to a fixed bias potential other than ground such as to a fixed positive potential relative to ground. In such a case, more current through the rectifying junction 154′ is required to cut off the transistor 144′.

Both the R-F amplifier stages 136 and 136′ shown in FIGS. 8 and 9 respectively have a built in voltage delay feature in addition to the AGC feature described above. The voltage delay in the circuit shown in FIG. 8 is the voltage required at the terminal $S_u$ required to overcome the bias voltage at the drain electrode 149 to change the impedance of the rectifying junction 152. In the circuit shown in FIG. 9, the voltage delay is the required voltage at the $S_u'$ terminal to change the impedance of the rectifying junction 154′.

Figure 10:
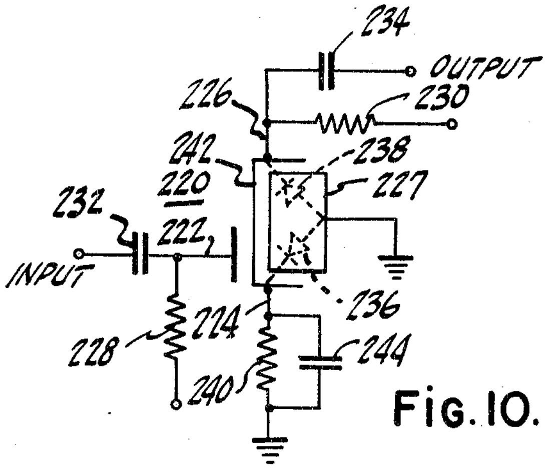
FIG. 10 is a schematic circuit diagram of another high frequency amplifier circuit embodying the invention.

Referring now to FIG. 10, there is shown a high frequency amplifier circuit comprising a field effect transistor 220 having a gate electrode 222, a source electrode 224, a drain electrode 226, and a substrate of semiconductor material 227. The gate and drain electrodes 222 and 226 are respectively biased through resistors 228 and 230 to desired bias potentials by a source of bias potential (not shown). Input signals are coupled to the gate electrode 222 through a coupling capacitor 232 from a signal source (not shown). The output signals of the amplifier circuit are derived across the resistor 230, and a capacitor 234 couples the ouput signals to an utilization circuit (not shown).

As previously described in reference to FIGS. 1, 2, 8 and 9 the source and drain regions S and D, shown in FIG. 2, are doped (N+) and the substrate of silicon body 12 is effectively doped (N) so that a pair of rectifying junctions are formed between the source and drain regions respectively and the substrate. The rectifying junctions 236 and 238, shown in FIG. 10, are connected to ground.

The source electrode 224 is connected to ground through a resistor 240 in order to provide self bias to the amplifier circuit. The resistor 240 is connected in parallel with a bypass capacitor 244. As the current flows from the drain electrode 226 through the conductive channel 242, the source electrode 224, and the resistor 240 to ground, the potential at the source electrode 224 becomes positive with respect to ground and thus back biases the rectifying junction 236. The capacitance of the rectifying junction 236 is reduced which reduces the total output capacitance of the field effect transistor 220 and hence the high frequency response characteristic of the amplifier is improved.

What is claimed:

1. An amplifier circuit comprising:

an insulated gate field effect semiconductor device having first and second electrodes corresponding to a source and a drain electrode formed on a substrate of semiconductor material, a gate electrode disposed between said first and second electrodes, said gate electrode being insulated from said substrate and effective to control the current between said first and second electrodes, said substrate of semiconductor material and said source and drain electrodes effectively operating as a pair of rectifying junctions connected between said substrate and between said first and second electrodes, respectively,
a resistor coupled between said source electrode and a point of reference potential,
circuit output means including a source of unidirectional potential coupled between said drain electrode and said point of reference potential,
means coupled to said gate electrode for biasing said gate electrode to a desired bias potential with respect to said point of reference potential,
circuit means for coupling input signals to said gate electrode, and
means connecting said substrate of semiconductor material to said point of reference potential so that the rectifying junction effectively connected between said substrate and said source electrode is back-biased whereby the effective capacitance of said rectifying junction is reduced thereby reducing the output capacitance of said field effect semiconductor device and thus increasing the frequency response of of said amplifier circuit.

2. An amplifier circuit comprising:
an insulated gate field effect semiconductor device having drain and source electrodes formed on a substrate of semiconductor material, and a control electrode insulated from said substrate and being disposed between said drain and source electrodes in a position closer to said source electrode, said source and drain electrodes being connected through a conductive channel so that current flows from said electrode to said source electrode when the bias potential at said drain electrode is positive with respect to the bias potential of said source electrode,
an input circuit coupled between said gate and source electrodes, a tunable output circuit coupled between said drain and said source electrodes,
means for applying a bias potential between said drain and source electrodes so that said source electrode is biased negatively with respect to said drain electrode,
means coupling said output circuit to said input circuit for neutralizing the inherent feedback energy through the inherent capacitance between said drain and gate electrodes,
said neutralizing circuit means including a capacitor having a value such that it effectively feeds back energy 180° out of phase with the energy fed back through said inherent capacitance and having equal amplitude, and
circuit means for connecting said substrate to said source electrode.

3. In combination:
first and second insulated field effect semiconductor device having gate, drain and source electrodes and each having a non-linear log transconductance versus gate bias voltage characteristic,
tunable input circuit means coupled to said gate electrode of said first field effect semiconductor device,
circuit coupling means for connecting said drain electrodes and said source electrodes of said first and second field effect semiconductor devices to each other respectively, so that said first and second field effect semiconductor devices are connected in parallel,
separate bias circuit means for biasing said gate electrodes of said first and second field effect semiconductor devices to different bias potentials respectively, whereby said log transconductance versus gate bias voltage characteristics are combined into a composite log transconductance versus gate bias voltage characteristic which is substantially linear,
tunable output circuit means coupled to said drain electrodes of said first and second field effect semiconductor devices, and
a variable capacitor coupled between said output and input circuits for neutralizing the energy fed back from said output circuit to said input circuit though the inherent capacitance of each of said first and second field effect semiconductor device.

4. A signal translating circuit comprising:
a semiconductor device having a gate, drain and source electrodes, and having a substrate of semiconductor material on which said electrodes are formed, said drain and source electrodes effectively forming rectifying junctions with said substrate, said gate electrode being insulated from said substrate of said semiconductor material,
means connecting said gate, source and drain electrodes as a signal translating circuit, and
means for applying a voltage between said substrate and said source electrode.

5. A signal translating circuit comprising:
a semiconductor device having gate, drain and source electrodes, and having a substrate of semiconductor material on which said electrodes are formed,
said gate electrode being insulated from said substrate of semiconductor material,
means connecting said gate, source and drain electrodes as a signal translating circuit, and
means for applying a voltage to said substrate to control the efficiency of translation of said circuit so that the efficiency of translation of said circuit is reduced as the voltage applied to said substrate is made positive relative to the voltage of said source or drain electrodes.

6. A signal translating circuit comprising:
a semiconductor device having a gate, drain and source electrodes, and having a substrate of semiconductor material on which said electrodes are formed, said substrate and said source and gate electrodes operating effectively as a pair of rectifying junctions connected between said source and drain electrodes and said substrate,
said gate electrode being insulated from said substrate of semiconductor material,
means connecting said gate, source and drain electrodes as a signal translating circuit, and means for applying a voltage to said substrate to control the efficiency of said translation circuit whereby the efficiency of said translation circuit is reduced as the voltage applied to said substrate forward biases said rectifying junctions.

7. An amplifier circuit comprising:
an insulated gate fiield effect transistor having gate, drain and source electrodes and having a substrate of semiconductor material, said source of drain electrodes being coupled to each other by a conductive channel, each of said source and drain electrodes being coupled to said substrate of semiconductor material by separate current paths having non-linear impedance characteristics that are a function of the relative potential between said substrate of semiconductor material and said source and drain electrodes,
circuit means coupled to said gate electrode for applying input signals to be amplified,
output circuit means coupled between said drain and source electrodes for deriving amplified output signals, and
circuit means coupled to said substrate of semiconductor material for applying a voltage having an amplitude that varies as a function of the average amplitude of said input signals to vary the relative potential between said substrate of semiconductor material and each of said drain and source electrodes whereby the impedance presented by said current paths vary as a function of the amplitude of said input signal and the gain of said amplifier is reduced when said average amplitude of said input signals increases.

8. In combination:
first and second insulated gate field effect semiconductor devices each having a gate electrode, a drain electrode and a source electrode, and each having a sharp cut-off transconductance versus bias voltage characteristic,
tunable input circuit means coupled to said gate electrode of said first field effect semiconductor device,
circuit means for coupling said source electrodes of said first and second field effect semiconductor devices to each other,
means for coupling said drain electrodes of said first and second field effect semiconductor devices to each other so that said semiconductor devices are connected in parallel,
output circuit means coupled to said drain electrodes to derive output signals, and
separate biasing means connected to said gate electrodes of said field effect semiconductor devices to bias said gate electrodes to different bias potentials respectively, so that said transconductance versus gate bias voltage characteristics are combined in a composite transconductance versus gate bias voltage characteristic which has remote cut-off.

9. In combination:
first insulated gate field effect semiconductor device having gate, drain and source electrodes, and having a high transconductance value and a sharp cut-off transconductance versus gate bias voltage characteristic,
second insulated field effect semiconductor device having gate, drain and source electrodes, and having a low transconductance value and a remote cut-off transconductance versus gate bias voltage characteristic,
circuit means for connecting said first and second field effect semiconductor devices in parallel to each other,
means connected to said gate electrode of said first semiconductor device for applying input signals,
means for coupling said input signals to said gate electrode of said second field effect semiconductor device, and
bias circuit means for biasing said gate electrodes to different bias potentials respectively, whereby the composite transconductance versus gate voltage characteristic has a remote cut-off.

10. An amplifier circuit comprising:
an insulated gate field effect semiconductor device having gate, drain and source electrodes, and having a substrate of semiconductor material where said drain and source electrodes are formed, said drain and source electrodes effectively forming a rectifying junctions with said substrate, said gate electrode being insulated from said substrate of semiconductor material, said drain and source electrodes being connected by a conductive channel,
input circuit means coupled between said gate and source electrodes for applying input signals to said amplifier,
output circuit means coupled between said drain and source electrodes to derive amplified output signals,
means coupled to said substrate of semiconductor material for applying a signal voltage which varies as a function of the amplitude of said input signals to said substrate of semiconductor material to control the amplitude of said output signals.

11. An amplifier circuit comprising:
an insulated gate field effect transistor having drain, source and gate electrodes and a substrate of semiconductor material, said drain and source electrodes having a conductive channel for current flow between said drain and source electrodes, said source and drain electrodes effectively forming rectifying junctions with said substrate of semiconductor material,
circuit means coupled between said gate and source electrodes for applying input signals to said amplifier,
output circuit means coupled between said drain and source electrodes for deriving output signals, and
AGC circuit means coupled to said substrate of semiconductor material for applying a variable bias potential to said substrate of semiconductor material whereby when said variable bias potential is positive with respect to the bias potential of said drain and source electrodes current flows between said substrate and each of said drain and source electrodes, and when said variable bias potential is negative with respect to the bias potential of said source and drain electrodes there is no current flow between each of said source and drain electrodes and said substrate.

12. A signal translating circuit comprising:
an insulated gate field effect semiconductor device having first and second electrodes corresponding to a source and a drain electrode formed on a substrate of semiconductor material, said substrate and said source of drain electrodes operating as a pair of rectifying junctions effectively connected between said source and drain electrodes and said substrate respectively, and a gate electrode disposed between said source and drain electrodes in a position closer to said source electrode, said gate electrode being insulated from said substrate and being effective to control the current between said first and second electrodes, said source and drain electrodes being connected by a conductive channel,
means connecting said gate, source and drain electrodes as a signal translating circuit, and
circuit means for applying a bias potential between said source electrode and said substrate so that the rectifying junction effectively connected between said source electrode and said substrate is forward biased.

13. An amplifier circuit comprising:
an insulated gate field effect transistor having gate, drain and source electrodes and having a substrate of semiconductor material, said drain and source electrodes forming a rectifying junctions with said substrate, each of said source and drain electrodes having an effective current path with said substrate of semiconductor material which varies as a function of the relative potential between said substrate of semiconductor material and the corresponding one of said source and drain electrodes,
circuit means coupled to said gate electrode for applying input signals to be amplified,
output circuit means coupled between said drain and source electrodes for deriving amplified output signals, and
circuit means coupled to said substrate of semiconductor material for varying the relative potential between said substrate of semiconductor material and at least one of said drain and source electrodes.

14. A signal translating circuit comprising:
a semiconductor device having a gate, drain and source electrodes, and having a substrate of semiconductor material on which said electrodes are formed, said drain and source electrodes forming rectifying junctions with said substrate, said gate electrode being insulated from said substrate of semiconductor material;
means connecting said gate, source and drain electrodes as a signal translating circuit, and
means for applying a reverse bias voltage to the rectifying junction between said substrate and source electrode.

15. In combination: a field effect transistor having source and drain regions formed on a substrate of semiconductor material with individual electrodes connected to each of said drain and source regions and said substrate, the interface between said drain and source regions and said substrate forming rectifying junctions, the portion of the substrate separating said drain and source regions forming a channel of controllable conductivity, and a gate electrode insulated from said substrate and overlying a portion of said channel for controlling the conductivity thereof, and circuit means providing connections to said gate, source, drain and substrate electrodes.

References Cited

UNITED STATES PATENTS

| | | | |
|---|---|---|---|
| 2,716,733 | 8/1955 | Roark. | |
| 2,949,580 | 8/1960 | Eland | 330—79 |
| 3,010,033 | 11/1961 | Noyce. | |

| | | | |
|---|---|---|---|
| 3,102,230 | 8/1963 | Kahng | 307—88.5/21.4 XR |
| 3,105,177 | 8/1963 | Aigrain et al. | |

ROY LAKE, Primary Examiner

N. KAUFMAN, Assistant Examiner

U.S. Cl. X.R.

307—304; 330—38

UNITED STATES PATENT OFFICE

CERTIFICATE OF CORRECTION

Patent No. 3,513,405 Dated May 19, 1970

Inventor(s) David J. Carlson

It is certified that error appears in the above-identified patent and that said Letters Patent are hereby corrected as shown below:

Column 2, line 64, for "wafer", substitute--water--; column 3, line 12, for "stipped", substitute--stippled--; column 3, line 49, for "source", substitute--drain--; column 4, lines 9 & 10, delete "and hence"; column 5, lines 43, after "comprising", insert--the--; column 7, line 14, for "electrode", substitute--electrodes--; column 7, line 16, for "or" substitute--of--; column 7, line 45, for gate", substitute--drain--; column 9, line 30, after "said", insert--drain--.

SIGNED AND SEALED

SEP 29 1970

(SEAL)
Attest:

Edward M. Fletcher, Jr.
Attesting Officer

WILLIAM E. SCHUYLER, JR.
Commissioner of Patents